United States Patent
Wu et al.

(10) Patent No.: US 7,675,742 B2
(45) Date of Patent: Mar. 9, 2010

(54) RACK-MOUNTED KVM MODULE WITH POSITIONING MECHANISM

(75) Inventors: Sui-An Wu, Taipei Hsien (TW); You-Lin Shih, Taipei Hsien (TW)

(73) Assignee: ATEN International Co, Ltd, Taipei Hesien (TW)

( * ) Notice: Subject to any disclaimer, the term of this patent is extended or adjusted under 35 U.S.C. 154(b) by 433 days.

(21) Appl. No.: 11/359,732

(22) Filed: Feb. 22, 2006

(65) Prior Publication Data

US 2007/0195496 A1     Aug. 23, 2007

(51) Int. Cl.
*G06F 1/16*     (2006.01)

(52) U.S. Cl. ............... 361/679.08; 455/575.8; 248/346.01; 211/134; 345/169

(58) Field of Classification Search ........... 361/683, 361/688, 724–727, 679.05, 679.11, 679.09, 361/679.3, 679.15; 211/26, 150, 134, 26.2; 248/222.12, 278.1, 188.6, 346.01; 312/334.1, 312/334.4, 223.1, 223.2, 208.1; 455/566, 455/575.4, 552.1, 575.8; 345/163, 169, 1.3; 400/489; 108/143, 50.01

See application file for complete search history.

(56) References Cited

U.S. PATENT DOCUMENTS

| | | | | |
|---|---|---|---|---|
| 4,496,200 | A * | 1/1985 | Hagstrom et al. | 312/223.3 |
| 5,168,427 | A * | 12/1992 | Clancy et al. | 361/679.12 |
| 5,388,032 | A * | 2/1995 | Gill et al. | 700/17 |
| 5,546,334 | A * | 8/1996 | Hsieh et al. | 708/141 |
| 5,764,474 | A * | 6/1998 | Youens | 361/679.12 |
| 6,185,092 | B1 * | 2/2001 | Landrum et al. | 361/683 |
| 6,201,690 | B1 * | 3/2001 | Moore et al. | 361/683 |
| 6,209,979 | B1 * | 4/2001 | Fall et al. | 312/330.1 |
| 6,609,034 | B1 * | 8/2003 | Behrens et al. | 700/19 |
| 6,666,340 | B2 * | 12/2003 | Basinger et al. | 211/26 |
| 6,827,409 | B2 * | 12/2004 | Michael | 312/223.3 |
| 6,856,505 | B1 * | 2/2005 | Venegas et al. | 361/683 |
| 6,956,735 | B2 * | 10/2005 | Lee et al. | 361/683 |
| 6,962,397 | B2 * | 11/2005 | Dobler et al. | 312/333 |
| 6,992,882 | B2 * | 1/2006 | Wang | 361/679.57 |
| 7,123,471 | B2 * | 10/2006 | Wang et al. | 361/679.09 |

FOREIGN PATENT DOCUMENTS

| | | |
|---|---|---|
| CN | 2521975 | 11/2002 |
| CN | 1631295 | 6/2005 |

* cited by examiner

*Primary Examiner*—Hung V Duong
(74) *Attorney, Agent, or Firm*—Patterson & Sheridan LLP; Keith P. Taboada

(57) ABSTRACT

A rack-mounted KVM module is configured for a server rack. An L-shaped supporting frame, which has a vertical plane and a horizontal plane, is coupled to the sever rack. A flat panel display is coupled to the vertical sliding rail to move along the L-shaped supporting frame horizontally. A keyboard module is coupled to the horizontal sliding rail to move along the L-shaped supporting frame horizontally. A positioning mechanism is disposed in the horizontal sliding rail. The positioning mechanism consists mainly of an outer rail, an inner rail, a link bracket, a latch and a positioning switch. The latch is swiveled to engage a notch of the latch in a block portion of the outer rail or to remove the notch thereof from the block portion to respectively lock or unlock a fixed position when the link bracket is slid along the inner rail by moving the positioning switch.

19 Claims, 5 Drawing Sheets

RACK-MOUNTED KVM MODULE WITH POSITIONING MECHANISM

BACKGROUND

1. Field of Invention

The present invention generally relates to a KVM (keyboard, Video, and Mouse) module. More particularly, this invention relates to a rack-mounted KVM module with a positioning mechanism.

2. Description of Related Art

Information technology and the computer industry are highly developed now. People rely heavily on computer systems. Due to increasingly reduced office space, area occupied by computer servers must also be reduced. The space occupied by one computer server is typically greater than or equal to that of a desktop computer. Accordingly, the management of computer servers is difficult and space utilization is tightened. Some companies have two or three computer servers, while others may have more than a thousand computer servers. Computer server management and space utilization become more critical in companies with more computer servers.

Assembling computer servers on standard server racks is the mainstream arrangement such that computer servers and racks can be centrally managed and easily stacked. In practice, KVM switches are utilized to monitor and control the computer servers more effectively. With KVM switches, it is possible to manage multiple computers with only one set of keyboard, video monitor and mouse, which saves both space and cost. The KVM switches are usually mounted in the standard server rack. A KVM switch may also be integrated with a flat panel display, a keyboard and a cursor control device. In such an integrated KVM module, usually called a LCD KVM or a KVM drawer, the KVM switch is usually stationary and the flat panel display, the keyboard and the cursor control device can be slid out from the system rack to a extend position for operation and slid back into the system rack to a closed position for storage.

However, due to the sliding characteristic of the rack-mounted KVM modules, vibrations may cause unexpected withdrawal or motion to damage the components. Further, it might also be possible that system operators get injured by the sliding components. Thus, rack-mounted KVM modules need further stability improvements to provide a sturdy, reliable and user-friendly working environment for users.

SUMMARY

It is therefore a first objective of the present invention to provide a sturdy, and reliable rack-mounted KVM module.

It is a second objective of the present invention to provide a keyboard module with a position mechanism for the rack-mounted KVM module.

In accordance with the foregoing and other objectives of the present invention, a rack-mounted sliding KVM module is configured for a server rack. An L-shaped supporting frame, which has a vertical plane and a horizontal plane, is coupled to the sever rack. A vertical sliding rail is configured on the vertical plane of the L-shaped supporting frame. A flat panel display is coupled to the vertical sliding rail to move along the L-shaped supporting frame horizontally. A horizontal sliding rail is configured on the horizontal plane of the L-shaped supporting frame. A keyboard module is coupled to the horizontal sliding rail to move along the L-shaped supporting frame horizontally. A positioning mechanism is disposed in the horizontal sliding rail. The positioning mechanism consists mainly of an outer rail, an inner rail, a link bracket, a latch and a positioning switch. The inner rail slides along the outer rail. The link bracket slides along the inner rail to swivel the latch, which is pivotally connected with the inner rail. The latch is swiveled to engage a notch of the latch in a block portion of the outer rail or to remove the notch thereof from the block portion to respectively lock or unlock a fixed position when the link bracket is slid along the inner rail by moving the positioning switch.

Accordingly, the racked-mounted KVM module according to the present invention provides a sturdy and reliable environment for controlling the server computers. In combination with the sturdy positioning mechanism, the racked-mounted KVM module can be operated more safely and stably whenever the sliding flat panel display and keyboard module are drawn out or retracted.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1A:
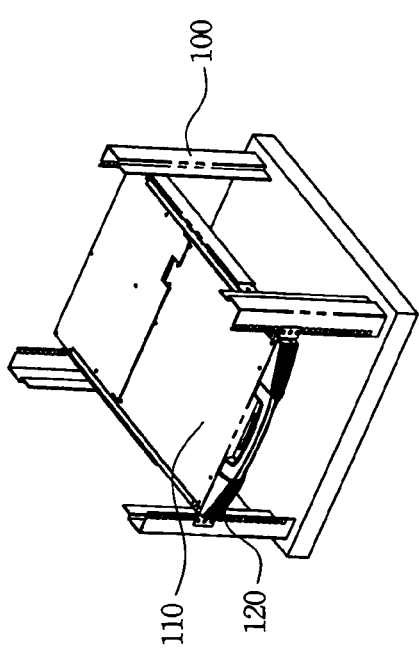
FIGS. 1A to 1D illustrate a preferred embodiment of the rack-mounted KVM module according to the present invention.
Figure 1B:
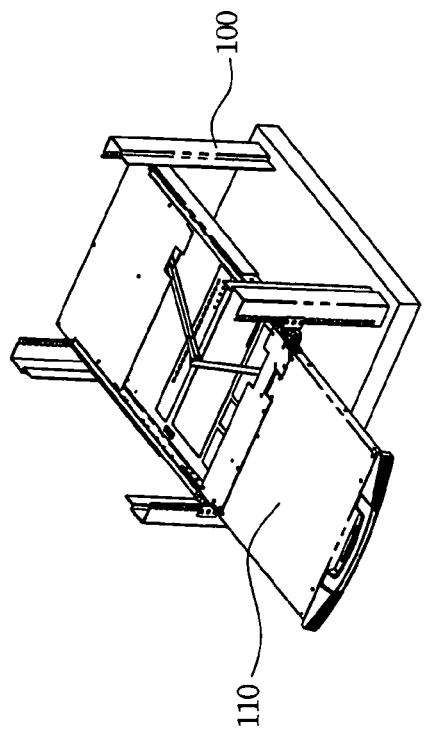
Figure 1C:
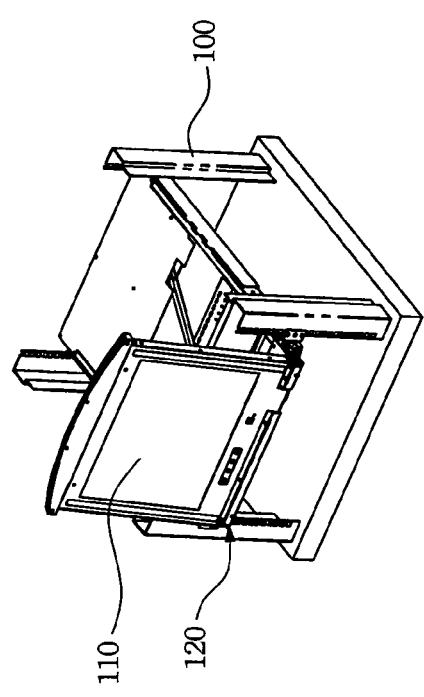
Figure 1D:
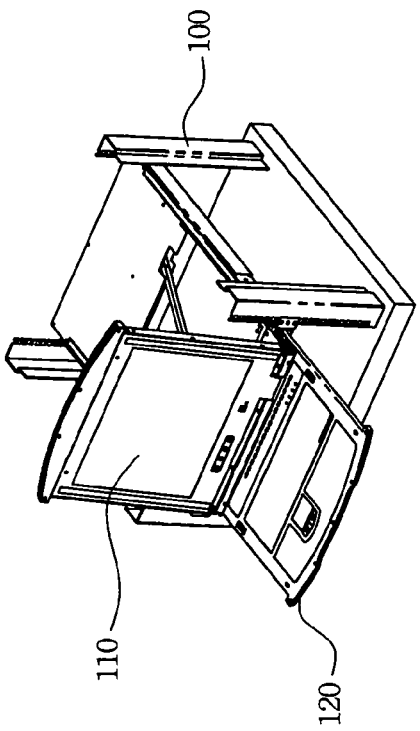

FIGS. 1A to 1D illustrate a preferred embodiment of the rack-mounted KVM module according to the present invention. The rack-mounted KVM module is preferably configured on a server rack 100, such as a standard server rack. The rack-mounted KVM module according to the present invention includes a flat panel display 110 and a keyboard module 120, and both may be able to slide in or out of the server rack 100. FIG. 1A illustrates the sliding flat panel display 110 and keyboard module 120 retracted in the server rack 100. FIG. 1B illustrates the flat panel display 110 drawn out from the server rack 100. FIG. 1C illustrates the flat panel display 110 drawn out alone and opened upwardly, and FIG. 1D illustrates the flat panel display 110 and keyboard module 120 drawn out simultaneously. The above design allows users to draw out the KVM module to use functions of keyboard-video-mouse conveniently, and retract the KVM module conveniently for storage.

Figure 2:
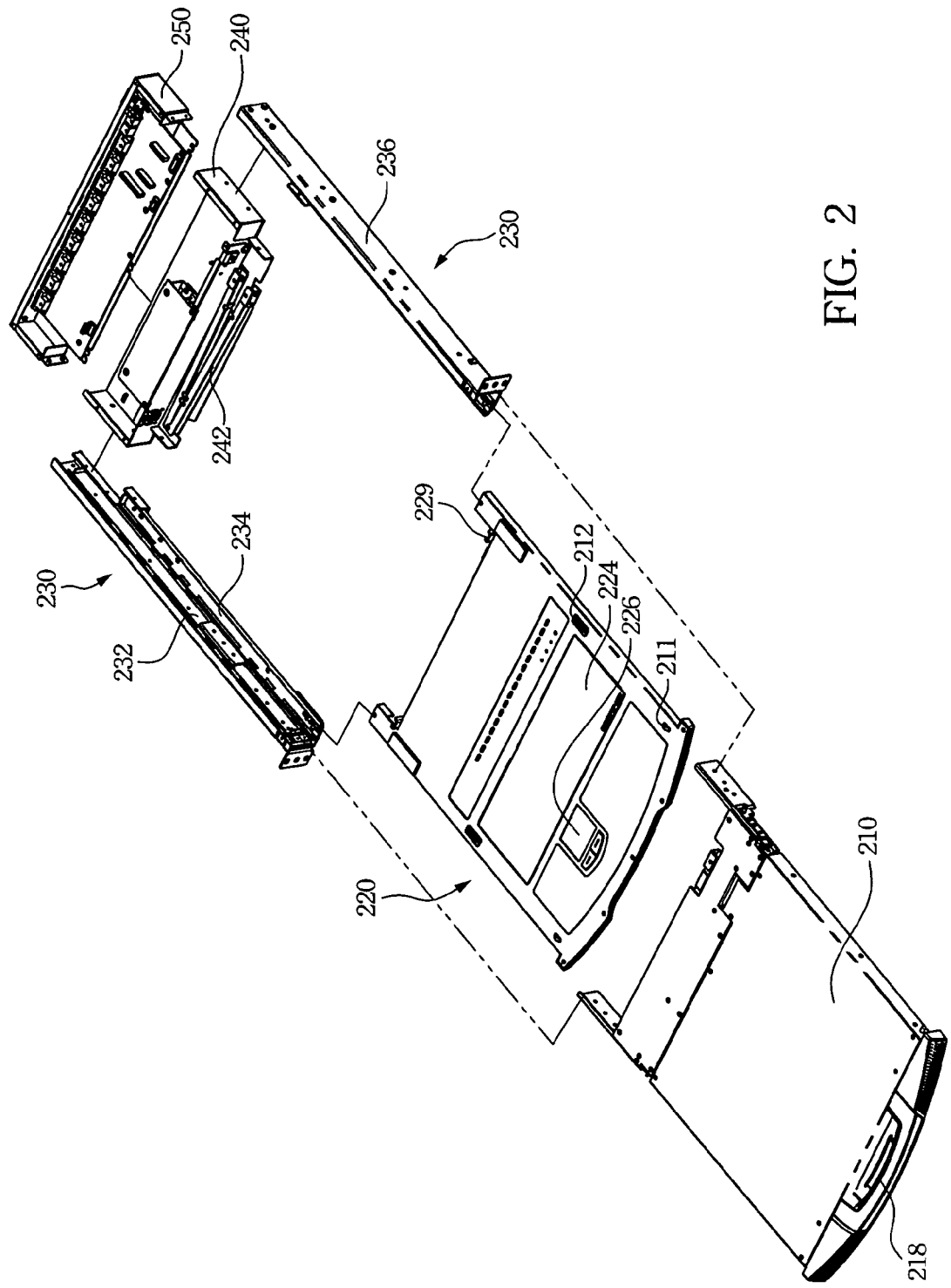
FIG. 2 illustrates an exploded view of a KVM module according to one preferred embodiment of the present invention.

FIG. 2 illustrates an exploded view of a KVM module according to one preferred embodiment of the present invention. Referring to FIG. 2, the KVM module includes a flat panel display 210, a keyboard module 220, and a sliding module 230. The sliding module 230 is composed of an L-shaped supporting frame 236, a first rail 232, and a second rail 234. The first rail 232 is preferably a vertical sliding rail, and the second rail 234 is preferably a horizontal sliding rail 234 perpendicular to the first rail 232. The L-shaped supporting frame 236 is a rigid supporting frame for coupling with the server rack and supporting the vertical sliding rail 232 and the horizontal sliding rail 234 thereon. The vertical sliding rail 232 is fixed on a vertical plane of the L-shaped supporting frame 236, and the horizontal sliding rail 234 is fixed on a horizontal plane of the L-shaped supporting frame 236.

The flat panel display 210 couples to the vertical sliding rail 232 of the sliding module 230 to allow the flat panel display 210 to slide horizontally along the sliding module 230. The flat panel display 210 is thus allowed to be retracted or drawn out on the sliding module 230. The keyboard module 220 couples to the horizontal sliding rail 234 of the sliding module 230 to allow the keyboard 220 to slide horizontally along the sliding module 230; thus enabling the keyboard 220 to be retracted or drawn out on the sliding module 230.

The flat panel display 210 and the keyboard module 220 independently couple to respective vertical sliding rail 232 and horizontal sliding rail 234 so that the user may draw out the flat panel display 210 alone to monitor the server computers or simultaneously draw out both the flat panel display 210 and the keyboard module 220 to control the server computers on demand. That is to say, the keyboard module 220 can be drawn out from the sliding module 230, from the server rack, to control the server computers with keyboard 224 and touch pad 226 on the keyboard module 220 according to needs. It should be noticed that the touch pad 226 for the KVM module may be replaced with any kinds of cursor control devices such as a mouse, a trackball, a touch pad, or even a touch screen by the person with the ordinary skills in the art. By the term "keyboard module", it doesn't merely mean "keyboard" itself, but also refers to an input device housing or something of the sort.

The keyboard module 220 further has a linking plate 229 such that the keyboard module 220 is not able to be drawn out when the flat panel display 210 is retracted and locked in the sever rack. However, the linking plate 229 does not bind the keyboard module 220 with the flat panel display 210. Thus, the flat panel display 210 can be drawn out alone using a handle 218.

The keyboard module 220 further has a positioning switch 212 on the top surface of the housing 221 for controlling (lock or unlock) its position when the keyboard module 220 is drawn out to the allowable limit of the sliding rail module 230.

Furthermore, a control module 240 is configured behind the flat panel display 210 and the keyboard module 220 to transmit power and signals. The control module 240 further includes a cable supporting link 242, which is able to extend or contract and continue transmitting power and signal to the flat panel display 210 and the keyboard 220 when the flat panel display 210 and the keyboard 220 are drawn out or returned. A KVM switch 250 is coupled to the control module 240, so the flat panel display 210 and the keyboard 220 module are thus utilized to control and monitor multiple server computers coupled with the KVM switch module 250.

Figure 3:
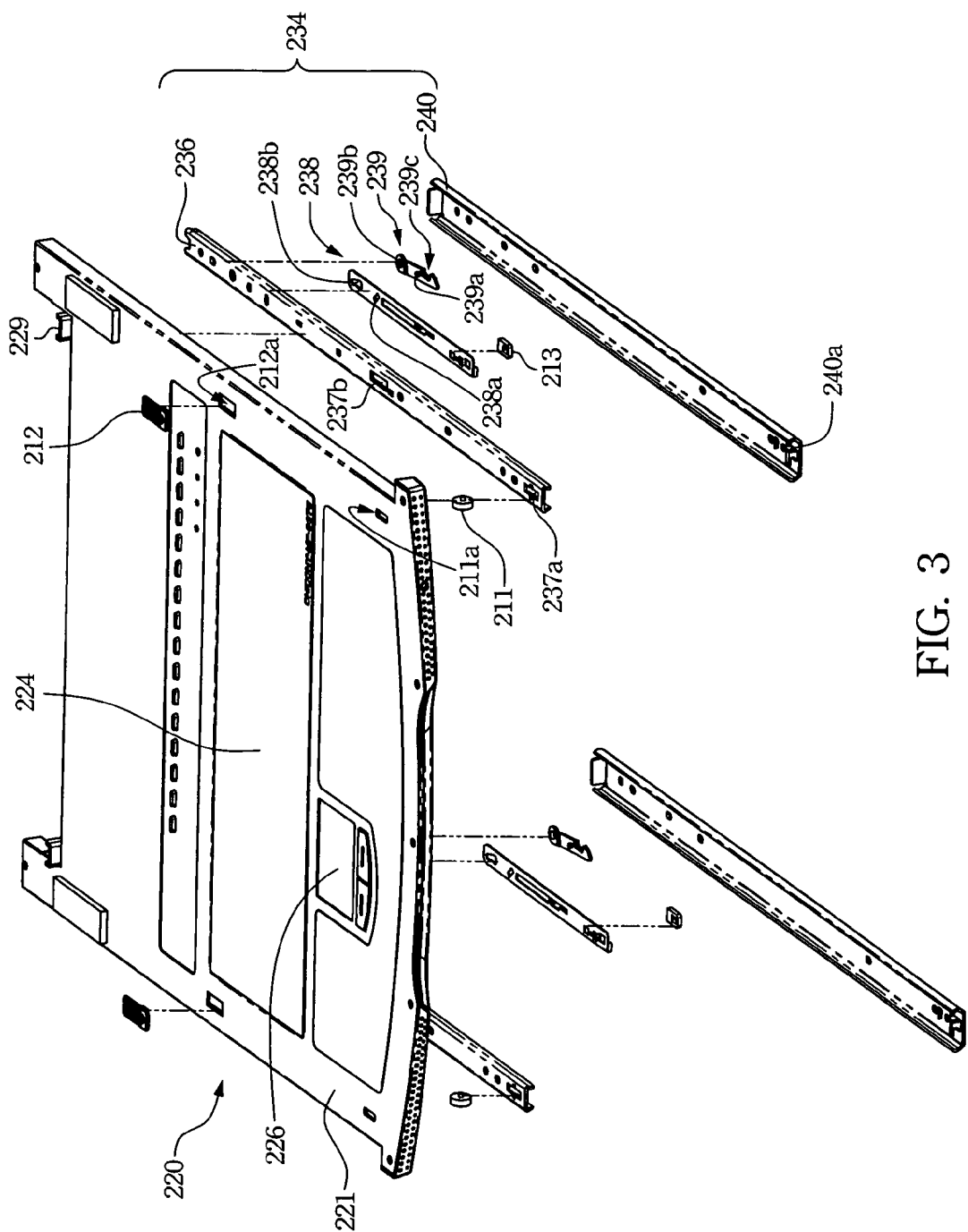
FIG. 3 illustrates an exploded view of a keyboard module and a sliding rail according to one preferred embodiment of the present invention.

FIG. 3 illustrates an exploded view of a keyboard module 220 and a horizontal sliding rail 234 according to one preferred embodiment of the present invention. As mentioned above, the keyboard module 220 couples to the horizontal sliding rail 234 to allow it to be retracted or drawn out on the sliding module 230. The horizontal sliding rail 234 consists mainly of an outer rail 240, an inner rail 236, a link bracket 238 and a latch 239. The outer rail 240 is secured on the vertical plane of the L-shaped supporting frame 236 in FIG. 2. The inner rail 236 is secured on the bottom side of the housing 221 of the keyboard module 220.

A positioning mechanism of the keyboard module 220 is also designed in the horizontal sliding rail 234. In particular, the link bracket 238 and the latch 239 are secured between the inner rail 236 and the outer rail 240 so as to form a positioning mechanism when all these elements are assembled. The link bracket 238 and the latch 239 are connected with the inner rail 236 via a hole 239b using bolts (not illustrated in the drawings). The latch 239 is pivotally connected with the inner rail 236 so that it can swivel within a limited range. A pin 239a of the latch 239 fits into a hole 238b of the link bracket 238. When the link bracket 238 slides along the inner rail 236 back and forth, the latch 239 would swivel within the limited range simultaneously. When the inner rail 236 is drawn out to the allowable limit, the latch 239 is swiveled to engage a notch 239c into the block portion 240a or remove the notch 239c from the block portion 240a to lock or unlock a fixed position of the inner rail 236. The above design can be employed to position the keyboard module 220 when it is drawn out to the allowable limit.

Positioning switches 212 and 213 are disposed both on two opposite sides of the horizontal sliding rail 234 to lock or unlock a fixed position of the keyboard module 220 when the keyboard module 220 is drawn out to the allowable limit of the sliding module. The positioning switches 212 and 213 are fixed on two opposite sides of the link bracket 238. Users can move the positioning switch 213 to unlock the keyboard 220, but have to detect where it is first by their fingers. Because the positioning switch 213 is disposed on the bottom side of the keyboard module 220, users cannot detect it by their eyes conveniently and their fingers might be injured when the keyboard module 220 is retracted. The positioning switch 212 is exposed by an opening 237b of the inner rail 236 and an opening 212a of the housing 211 such that users can see and move it conveniently without detecting where it is with their fingers.

Referring to FIGS. 2 and 3, a roller 211 is disposed between an opening 211a of the housing 211 and a slot 237a of the inner rail 236. The roller 211, which serves as a support, assists the flat panel display 210 to smoothly slide on top of the keyboard module 220 when the flat panel display 210 is drawn out or retracted alone on the sliding module.

Figure 4B:
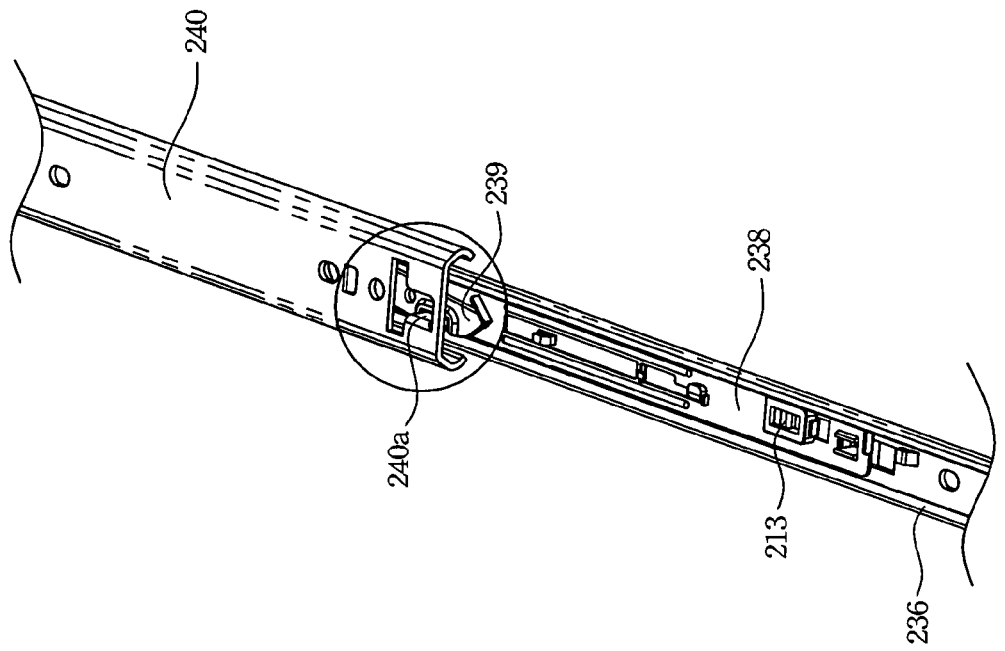
FIGS. 4A and 4B respectively illustrate a top view and a bottom view of the sliding rail of FIG. 3 in a locked status.
Figure 4A:
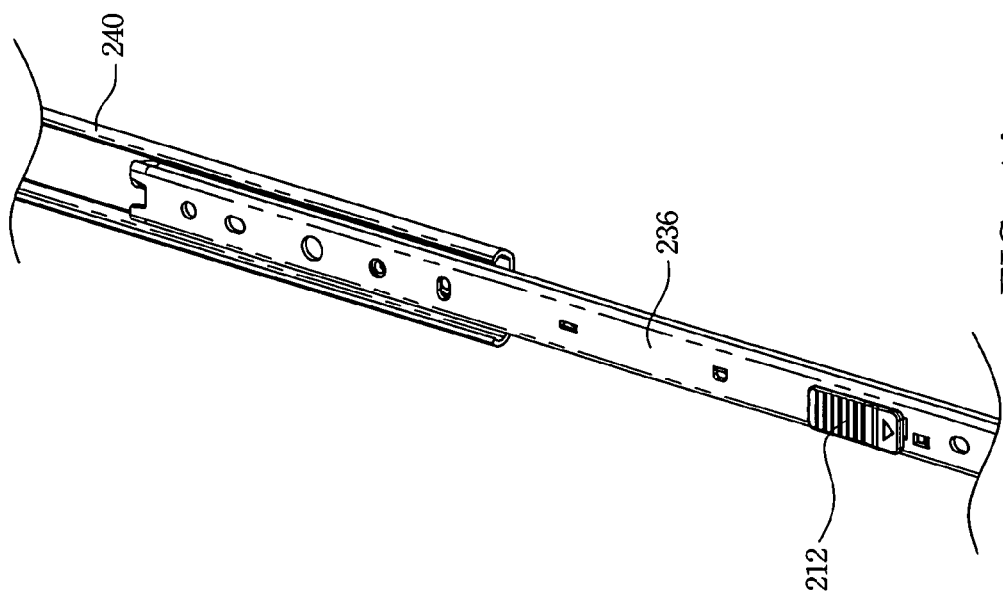

FIGS. 4A and 4B respectively illustrate a top view and a bottom view of the sliding rail of FIG. 3 in a locked status. When the keyboard module 220 is drawn out to the allowable limit of the sliding rail module 230, retrieval of the keyboard module 220 due to an unexpected vibration or force would occur without the positioning mechanism mentioned above. In a lock status, the latch 239 is swiveled to engage its notch 239c into the block portion 240a of the outer rail 240 such that the inner rail 236 is fixed. The keyboard module 220, which is secured on the inner rail 236, is also fixed at the allowable limit position of the sliding rail module 230.

Figure 5B:
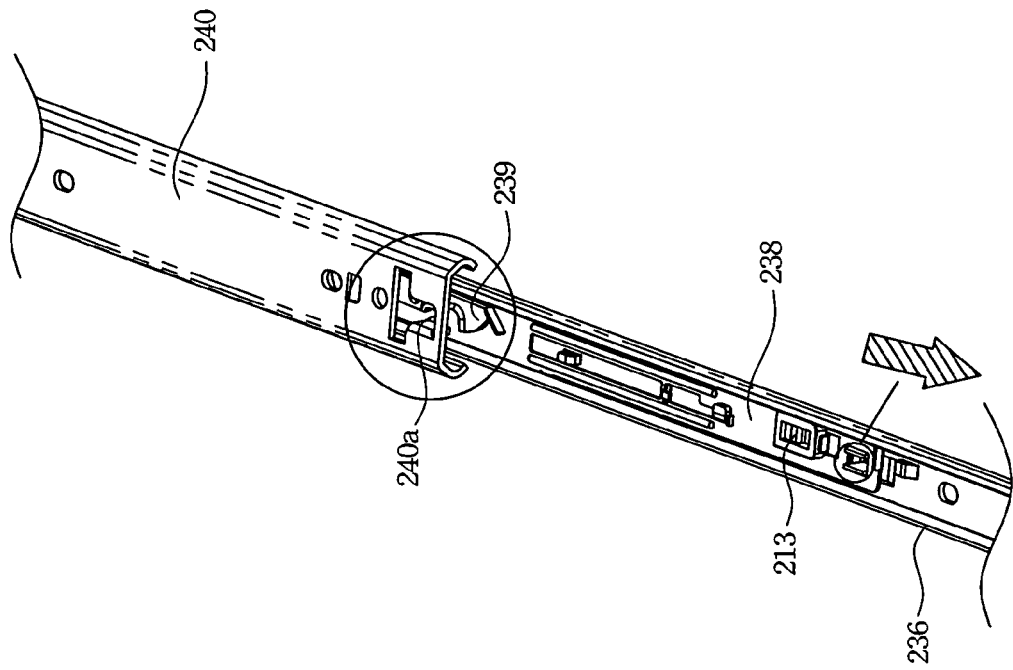
FIGS. 5A and 5B respectively illustrate a top view and a bottom view of the sliding rail of FIG. 3 of an unlocked status.
Figure 5A:
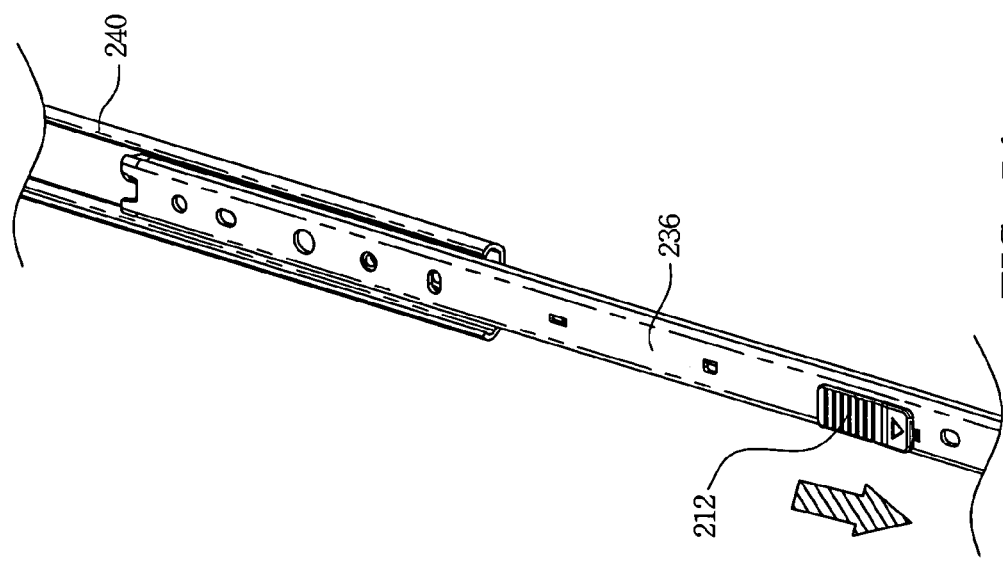

FIGS. 5A and 5B respectively illustrate a top view and a bottom view of the sliding rail of FIG. 3 in an unlocked status. In an unlocked status, the latch 239 is swiveled (by moving either one of the positioning switches 212 and 213 downwards) to remove its notch 239c from the block portion 240a of the outer rail 240 such that the inner rail 236 is released. The keyboard module 220, which is secured on the inner rail 236, is also released at the allowable limit position of the sliding rail module 230. In this preferred embodiment, the block portion 240a is disposed at an end of the outer rail 240. However, the block portion 240a may be disposed at any suitable position of the outer rail 240 according to demand.

Accordingly, the rack-mounted KVM module according to the present invention provides a sturdy and reliable environment for managing server computers. In combination with the sturdy positioning mechanism, the rack-mounted KVM module can be operated more safely and stably whenever the sliding flat panel display 210 and keyboard module 220 are retracted or drawn out.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A KVM module configured for a server rack, the KVM module comprising:
   a flat panel display;
   a keyboard module, having a housing;
   a cursor control device;
   a KVM switch for coupling the flat panel display, the keyboard module and the cursor control device to at least one computer;
   an L-shaped supporting frame secured on the server rack, wherein the L-shaped supporting frame comprises a vertical plane and a horizontal plane perpendicularly connected to the vertical plane;
   a first sliding rail secured on the vertical plane of the L-shaped supporting frame, wherein the flat panel display slides along the first sliding rail;
   a second sliding rail secured on the horizontal plane of the L-shaped supporting frame, wherein the keyboard module slides along the second sliding rail, and the keyboard module and the flat panel display slide respectively or in parallel directions;
   positioning switches fixed on two opposite sides of the second sliding rail, at least one of the positioning switch exposed by an opening on a top side of the housing, wherein the positioning switches are used to lock or unlock a fixed position of the keyboard module; and
   a positioning mechanism disposed in the second sliding rail for providing the fixed position of the keyboard module, the positioning mechanism comprising:
      an inner rail;
      a latch pivotally connected with the inner rail; and
      a link bracket for linking the positioning switch with the latch such that the latch is swiveled with respect to the link bracket to lock or unlock the fixed position of the keyboard module when the link bracket is driven by the moving positioning switch to slide along the inner rail.

2. The KVM module of claim 1, wherein the positioning mechanism further comprises:
   an outer rail, having a block portion, wherein the latch is swiveled to engage or disengage the block portion in order to respectively lock or unlock the fixed position of the keyboard module.

3. The KVM module of claim 2, wherein the outer rail is fixed to the server rack.

4. The KVM module of claim 1, wherein the inner rail is fixed to a bottom side of the housing.

5. The KVM module of claim 1, wherein the keyboard module further comprises at least one roller configured on the top side of the housing for supporting the flat panel display.

6. The KVM module of claim 5, wherein the roller is positioned between the housing and the inner rail, and part of the roller is exposed by another opening on the top side of the housing.

7. The KVM module of claim 1, wherein the keyboard further comprises a linking plate to link the keyboard with the flat panel display while drawing out the keyboard.

8. The KVM module of claim 1, wherein the cursor control device is a mouse, a touch pad, a track ball or a touch screen.

9. A sliding keyboard module comprising:
   an L-shaped supporting frame, having a vertical plane and a horizontal plane perpendicularly connected to the vertical plane;
   a vertical sliding rail secured on the vertical plane of the L-shaped supporting frame, wherein the vertical sliding rail is used for being coupled to an object, so that the object is capable of moving along the L-shaped supporting frame;
   a horizontal sliding rail secured on the top of the horizontal plane of the L-shaped supporting frame;
   a keyboard module coupling to the horizontal sliding rail to move along the L-shaped supporting frame horizontally, wherein the keyboard module and the object slide respectively or in parallel directions;
   a positioning mechanism disposed in the horizontal sliding rail, the positioning mechanism comprising:
      an outer rail, having a block portion;
      an inner rail, sliding along the outer rail;
      a positioning switch, secured on the link bracket and exposed by a first opening of the inner rail and a second opening on the top side of the keyboard module;
      a latch pivotally connected with the inner rail, the latch having a notch, wherein the latch is swiveled to engage the notch thereof in the block portion or to disengage the notch thereof from the block portion to respectively lock or unlock a stopped sliding relation between the inner rail and the outer rail;
      a link bracket, sliding along the inner rail for linking the positioning switch with the latch such that the latch is swiveled with respect to the link bracket when the link bracket is driven by moving the positioning switch to slide along the inner rail; and
   positioning switches fixed on two opposite sides of the second sliding rail, at least one of the positioning switch exposed by an opening on a top side of the housing, wherein the positioning switches are used to lock or unlock a fixed position of the keyboard module.

10. The sliding keyboard module of claim 9, wherein the L-shaped supporting frame further couples to a server rack.

11. The sliding keyboard module of claim 9, wherein the block portion is disposed at an end of the outer rail.

12. The sliding keyboard module of claim 9, wherein the outer rail is fixed to a server rack.

13. The sliding keyboard module of claim 9, wherein the inner rail is fixed to a bottom side of the keyboard module.

14. A sliding keyboard module comprising:
   a horizontal sliding rail;
   a keyboard module coupling to the horizontal sliding rail to move horizontally;

a positioning mechanism disposed in the horizontal sliding rail for providing a fixed position for the keyboard module; and positioning switches fixed on two opposite sides of the horizontal sliding rail and movably disposed within the keyboard module and at least one of the positioning switch exposed by an opening on a top side of the keyboard module, wherein the exposed positioning switch is used to slide with respect to the horizontal sliding rail to lock or unlock the fixed position of the keyboard module.

15. The sliding keyboard module of claim 14, wherein the positioning mechanism further comprises:

an outer rail, having a block portion;

an inner rail, sliding along the outer rail;

a latch pivotally connecting with the inner rail and swiveling to engage or disengage the block portion of the outer rail in order to respectively lock or unlock a stopped sliding relation between the inner rail and the outer rail such engaging or disengaging the fixed position of the keyboard module; and a link bracket for linking the positioning switch with the latch such that the latch being swiveled by the positioning switch.

16. The sliding keyboard module of claim 15, wherein the latch further has a notch, and the latch is swiveled to engage the notch thereof in the block portion or to disengage the notch thereof from the block portion to respectively lock or unlock the stopped sliding relation between the inner rail and the outer rail.

17. The sliding keyboard module of claim 15, wherein the block portion is disposed at an end of the outer rail.

18. The sliding keyboard module of claim 15, wherein the outer rail is fixed to a server rack.

19. The sliding keyboard module of claim 15, wherein the inner rail is fixed to a bottom side of the keyboard module.

* * * * *